United States Patent [19]

Tejima et al.

[11] Patent Number: 4,998,191
[45] Date of Patent: Mar. 5, 1991

[54] ILLUMINATING OPTICAL DEVICE

[75] Inventors: Yasuyuki Tejima; Ryota Ogawa, both of Tokyo, Japan

[73] Assignee: Asahi Kogaku Kogyo Kabushiki Kaisha, Tokyo, Japan

[21] Appl. No.: 427,379

[22] Filed: Oct. 27, 1989

[30] Foreign Application Priority Data

Oct. 28, 1988 [JP] Japan .................... 63-272815

[51] Int. Cl.$^5$ ............................. F21V 5/00
[52] U.S. Cl. ............................ 362/333; 362/268
[58] Field of Search .............. 350/167, 574; 362/268, 362/32, 326, 331, 332, 333, 339

[56] References Cited

U.S. PATENT DOCUMENTS

| 4,275,962 | 6/1981 | Midorikawa et al. | 355/1 |
|---|---|---|---|
| 4,451,872 | 5/1984 | Hartwig | 362/332 |
| 4,497,013 | 1/1985 | Ohta | 362/331 |
| 4,497,015 | 1/1985 | Konno et al. | 362/268 |
| 4,498,742 | 2/1985 | Uehara | 350/523 |
| 4,538,216 | 8/1985 | Mori et al. | 362/333 |
| 4,619,508 | 10/1986 | Shibuya et al. | 353/122 |
| 4,656,562 | 4/1987 | Sugina | 362/339 |
| 4,683,524 | 7/1987 | Ohta | 362/268 |
| 4,787,013 | 11/1988 | Sugina et al. | 362/339 |
| 4,841,341 | 6/1989 | Ogawa et al. | 355/43 |
| 4,852,980 | 8/1989 | Shinichi | 350/432 |

FOREIGN PATENT DOCUMENTS

| 0231029 | 8/1987 | European Pat. Off. . |
|---|---|---|
| 0267599 | 5/1988 | European Pat. Off. . |
| 56-81813 | 4/1981 | Japan . |
| 58-147708 | 9/1983 | Japan . |
| 63-113412 | 5/1988 | Japan . |

OTHER PUBLICATIONS

English Abstract of Japanese Publication No. 63-113412.
English Abstract of Japanese Publication No. 56-81813.
English Abstract of Japanese Publication No. 63-187229.
English Abstract of Japanese Publication No. 62-123423.
English Abstract of Japanese Publication No. 62-92912.
English Abstract of Japanese Publication No. 62-92913.
English Abstract of Japanese Publication No. 59-226317.
English Abstract of Japanese Publication No. 63-6502.
English Abstract of Japanese Publication No. 62-150315.
English Abstract of Japanese Publication No. 63-58301.
English Abstract of Japanese Publication No. 62-80617.
English Abstract of Japanese Publication No. 61-156218.
English Abstract of Japanese Publication No. 62-124522.
English Abstract of Japanese Publication No. 62-100724.
English Abstract of Japanese Publication No. 61-267722.
English Abstract of Japanese Publication No. 61-279822.
English Abstract of Japanese Publication No. 61-212816.

Primary Examiner—Stephen F. Husar
Assistant Examiner—Sue Hagarman
Attorney, Agent, or Firm—Sandler, Greenblum & Bernstein

[57] ABSTRACT

An illuminating optical device of the type in which light from a light source is made incident on a condenser lens through a fly-eye lens a light transmitting object to be illuminated is disposed between the condenser lens and a projection optical system. The degree of surface finish of the emergence surface of the fly-eye lens is made lower than that of the incident surface.

7 Claims, 4 Drawing Sheets

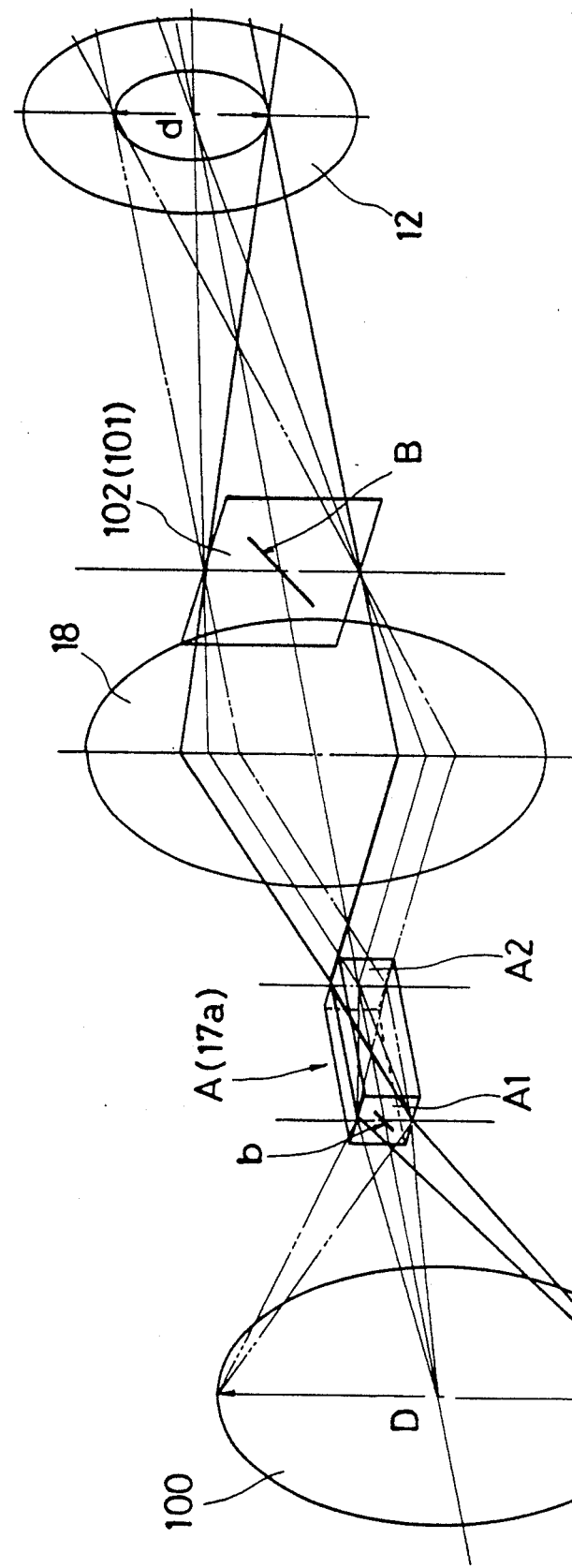
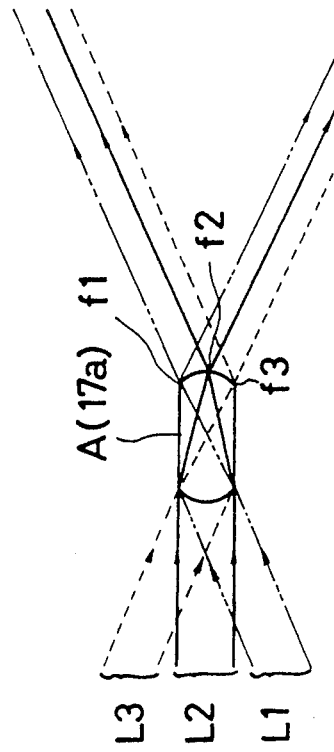

ILLUMINATING OPTICAL DEVICE

BACKGROUND OF THE INVENTION

1. Field of the Invention

The present invention relates to an illuminating optical device which may be used in optical apparatuses such as photomechanical process cameras, projection testers, steppers and film and other projectors. More particularly, the present invention pertains to an illuminating optical device that employs a fly-eye lens.

2. Description of Related Art

The fly-eye lens array is generally known as an optical element that converts information about the angle of light rays incident thereon into positional information. Namely, the rays of light which are incident at several different angles to a fly-eye lens element can be focused on their own focussing points individually, and the rays of lights focused thereon will be diffused from the focused points respectively. Consequently, it is employed as a light diffusing element for diffusing the light from a light source to illuminate an object uniformly. For example, when, in photomechanical processing system, a block copy film having the image of an original formed thereon by photographic process is illuminated to project the image of the film onto a presensitized plate through a projection optical system, the fly-eye lens array is disposed between the light source and a condenser lens to uniformly diffuse the light from the light source and illuminate the block copy film disposed between the condenser lens and the projection optical system with the uniformly diffused light. The fly-eye lens array has higher light diffusing effectiveness than that of a diffusing plate and it is therefore capable of illuminating an object even more uniformly.

Fly-eye lenses are generally employed in a part where light is condensed with a view to minimizing the overall size of the system and, therefore, a glass material having superior heat resistance, for example, quart glass, is employed to form fly-eye lenses. Quartz glass is costly and the cost of machining quart glass into a minute lens constituting a fly-eye lens is exceedingly high. In particular, the polished surfaces at the incidence and emergence sides of a fly-eye lens are required to have an extremely high degree of surface finish, and if the finished surfaces have flaws or sand marks left thereon, the lens is rejected as a defective. For these reasons, the prior art suffers from high production cost.

SUMMARY OF THE INVENTION

Under these circumstances, it is a primary object of the present invention to provide an illuminating optical device employing a fly-eye lens which is designed so that it is possible to lower the machining cost of the fly-eye lens with substantially no adverse effect on the illuminating performance and the quality of the project image.

The present invention has been accomplished on the basis of the finding that an illuminating optical device employing a fly-eye lens has the nature that "the image at the incidence surface side of the fly-eye lens is formed on the illuminated area and the image at the emergence surface side is formed at the position of the entrance pupil of the projecting lens" and hence a flaw in the incidence surface may appear on the illuminated area but no flaw in the emergence surface will appear on the illuminated area; therefore, the degree of surface finish of the emergence surface of the fly-eye lens has substantially no adverse effect on the illuminating performance and the quality of the projected image even if the surface finish of the emergence surface is not as good as would be required in the light of the conventional criteria.

In other words, the above-mentioned nature of an illuminating optical device employing a fly-eye lens means that the incidence surface of the fly-eye lens related to the illuminated area (i.e., the position where an object to be illuminated is placed) and the emergence surface of the lens related to the position of the entrance pupil of the projecting lens.

Accordingly, the present invention provides an illuminating optical device of the type in which light from a light source is made incident on a condenser lens through a fly-eye lens with a light-transmitting object to be illuminated being disposed between the condenser lens and a projection optical system, wherein the degree of surface finish of the emergence surface of the fly-eye lens is made lower than that of the incidence surface.

BRIEF DESCRIPTION OF THE DRAWINGS

FIGS. 1 and 2 are perspective views showing the principle of the illuminating optical device according to the present invention;

FIG. 5 is a sectional view showing the operating principle of a fly-eye lens unit.

DETAILED DESCRIPTION

Figure 3:
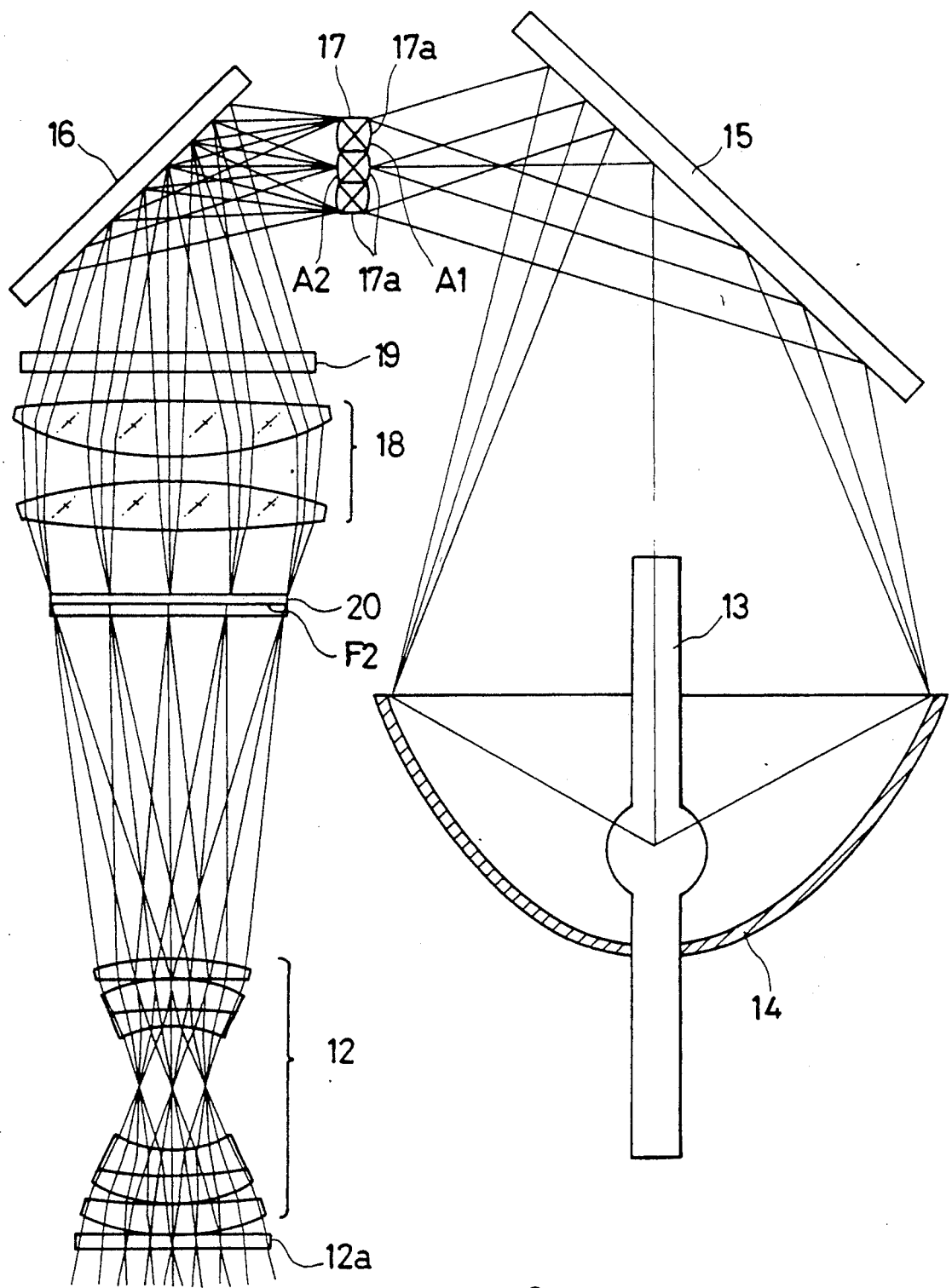
FIGS. 3 and 4 are sectional and perspective views, and respectively, of one embodiment the illuminating optical device according to the present invention in which the invention is applied to the magnifying printer of photomechanical processing.
Figure 4:
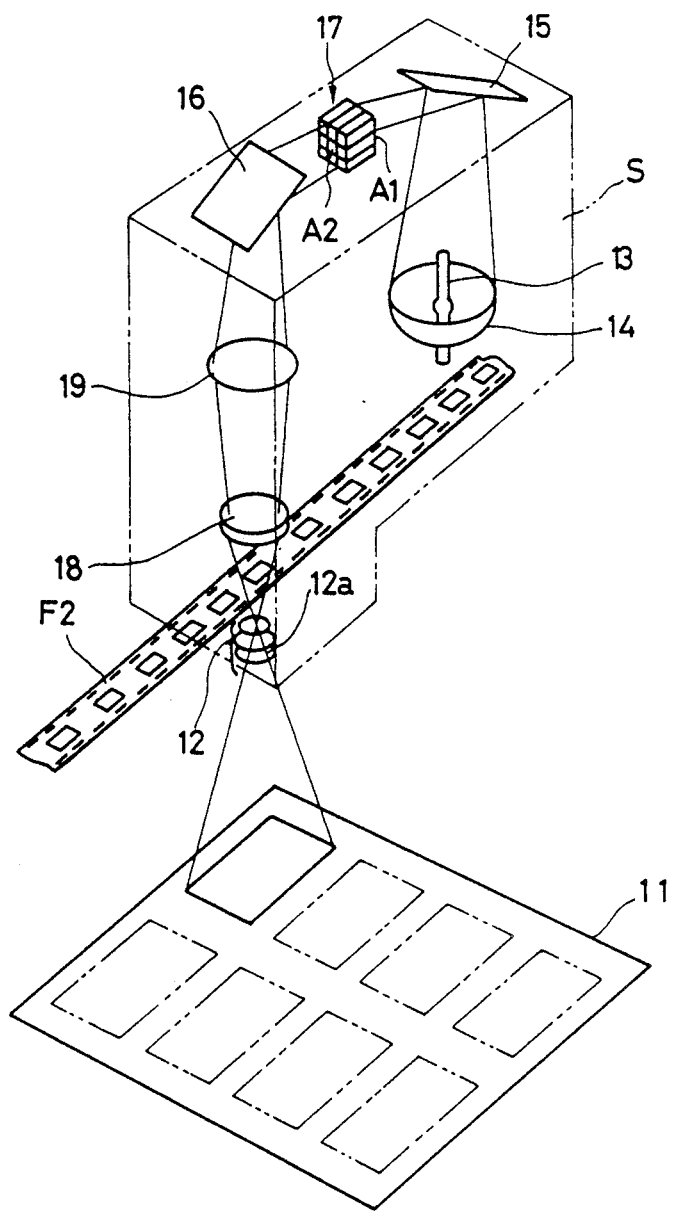

One embodiment of the present invention will be described below with reference to the accompanying drawings. FIGS. 3 and 4 show one embodiment of the illuminating optical device according to the present invention in which the invention is applied to the magnifying printer of photomechanical processing system. Referring to FIG. 4, an illuminating optical device S is disposed above a presensitized plate 11. The illuminating device S includes a projection optical system 12 which is arranged to project a photographed image formed on a block copy film F2 onto the presensitized plate 11. The projection optical system 12 has an interference filter 12a provided thereon in one unit for limiting the range of wavelengths of light reaching the presensitized plate 11.

An extra-high pressure mercury lamp 13 serving as a light source is disposed in the vicinity of the projection optical system 12. The mercury lamp 13 has an elliptical mirror 14, so that the light reflected and condensed by the elliptical mirror 14 reaches a condenser lens 18 after being reflected by first and second dichroic mirrors 15 and 16. A fly-eye lens 17 is disposed between the dichroic mirrors 15 and 16. The block copy film F2 that is an object to be illuminated is placed at the emergence side of the condenser lens 18, so that an image carried on the film F2 is formed on the presensitized plate 11 through the projection optical system 12. The reference numeral 19 denotes a heat absorbing filter, and the numeral 20 shown in FIG. 3 denotes a pair of transparent glass plates which sandwich the film F2 therebetween to maintain it in a planar state.

The feature of the present invention resides in the following. In the illuminating optical device S arranged as stated above, for example, the incidence surface A1 of each of the minute lenses 17a constituting in combination the fly-eye lens 17 is ideally finished so that it has no defect from the optical point of view, while the emergence surface A2 is finished roughly in comparison with the incidence surface A1. The difference in the degree of the surface finish between the two surfaces has no adverse effect on the illuminating performance and the quality of the projected image. The reason for this will be explained below with reference to FIGS. 1 and 2. It should be noted that the whole fly-eye lens 17 may be called fly-eye lens array and each minute lens 17a that constitutes the array may be called fly-eye lens. In the fly-eye lens, the rays of lights L1, L2 and L3 which are incident at several different angles to a fly-eye lens element can be focused on their own focussing points f1, f2 and f3 individually, and the rays of lights focused thereon will be diffussed from the focused points respectively as shown in FIG. 5.

Figure 1:
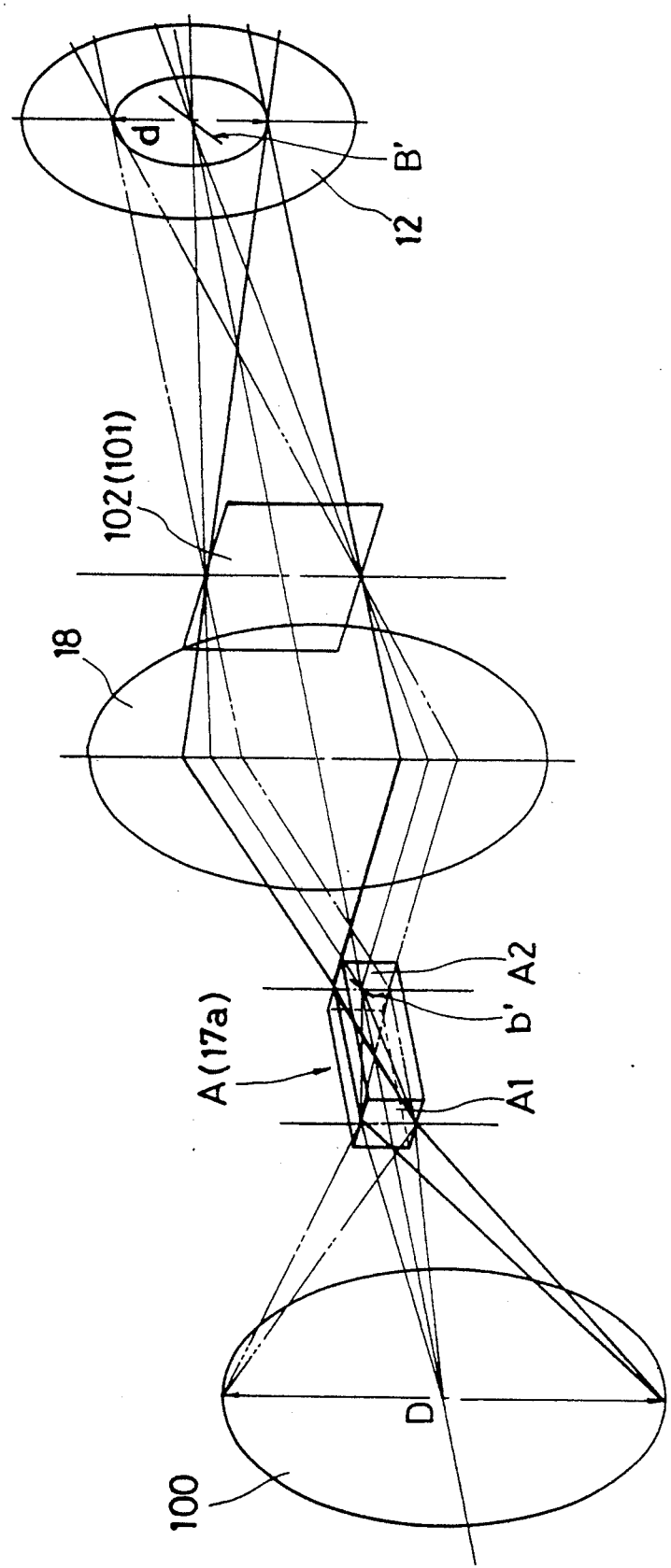

In FIGS. 1 and 2, the first and second dichroic mirrors 15 and 16 are not shown, a light source 100 is expressed by a circle the diameter D of which is equal to the greatest diameter of the elliptical mirror 14, and the projection optical system 12 is expressed by the entrance pupil the diameter of which is d. It is assumed that the minute lens 17a is a square drum lens A having a square cross section. The light emitted from the light source 100 is incident on the incidence surface A1 at one end of the square drum lens A and emerges from the emergence surface A2 at the other end and is then condensed through the condenser lens 18. The condensed light passes through an object to be illuminated which is placed in an illuminated area 102 and then enters the projection optical system 12.

In this illuminating system, the image of the incidence surface A1 at one end of the square drum lens A is formed on the illuminated area 102 (image plane 101) at the emergence side of the condenser lens 18, while the image of light emerging from the emergence surface A2 at the other end is formed at the position of the entrance pupil of the projection optical system 12. In other words, the incidence surface A1 and the imagery plane 101 are related to each other, and so are the emergence surface A2 and the entrance pupil position of the projection optical system 12. Further, the configuration of the incidence surface A1 is formed on the imagery plane 101 in the form of a similarly magnified image, while the image of light rays emerging from the emergence surface A2 is formed at the position of the entrance pupil of the projection optical system 12 in the form of a similarly magnified image.

In the above-described relationships, if there is a flaw b in the incidence surface A1, the image B of the flaw b is formed on the illuminated area 102, as shown in FIG. 2. If there is a flaw b' in the emergence surface A2, the image B' of the flaw b' is formed at the position of the entrance pupil of the projection optical system 12, as shown in FIG. 1.

In the case of FIG. 2, the image B of the flaw b that is formed on the illuminated area 102 is projected onto the projection plane (the presensitized plate 11) through the projection optical system 12. Accordingly, the image B of the flaw b is superposed on the projection plane (the film F2), thus causing the quality of the projected image to be deteriorated. In the case of FIG. 1, however, the image B' of the flaw b' is not projected on the projection plane. Therefore, even if the degree of surface finish of the emergence surface A2 is relatively low, there is no adverse effect on the illuminating performance and the quality of the projected image.

Although in the foregoing embodiment a square drum lens having a square cross section is exemplarily employed as a fly-eye lens, it is clear that the present invention is valid independently of the cross-sectional configuration of each minute lens that constitutes a fly-eye lens. However, square or hexagonal drum lenses have the advantage that a large number of lenses can be readily aligned both lengthwise and breadthwise.

Thus, the illuminating optical device of the present invention is arranged such that the degree of surface finish of the emergence surface of each minute lens constituting a fly-eye lens is made lower than that of the incidence surface on the basis of the finding that the degree of surface finish of the emergence surface need not be high in comparison with the incidence surface that is required to have an extremely high degree of surface finish in order to obtain uniform illumination. Accordingly, it is possible to obtain an illuminating optical device at a lower cost than in the case of the conventional device in which the incidence and emergence surfaces are equally finished with a degree of accuracy, without sacrificing the illuminating performance and the quality of the projected image. In particular, it is a great advantage that it is possible to lower the degree of surface finish of one surface of a fly-eye lens that is generally formed from quartz glass which involves a high machining (polishing) cost and a high rejection rate. Thus, the present invention greatly contributes to lowering in the overall cost of the illuminating optical device.

We claim:

1. An illuminating optical device in which light from a light source is incident on a condenser lens, through a fly-eye lens, with a light-transmitting object to be illuminated disposed between said condenser lens and a projection optical system, wherein the degree of surface finish of the emergence surface of said fly-eye lens is lower that that of the incidence surface.

2. An illuminating optical device according to claim 1, wherein said fly-eye lens is formed of quartz glass.

3. An illuminating optical device according to claim 1, wherein said fly-eye lens comprises a minute lens which is a square drum lens having a square cross section.

4. An illuminating optical device comprising a light diffusing element in the form of a fly-eye lens which converts information about the angle of light rays incident thereon into positional information, wherein one of the two end faces, respectively constituting incidence and emergence surfaces, is less optically defective than the other, said one end face being defined as the incidence surface.

5. An illuminating optical device according to claim 4, wherein said fly-eye lens is formed of quartz glass.

6. An illuminating optical device according to claim 4, wherein said fly-eye lens comprises a minute lens which is a square drum lens having a square cross section.

7. A fly-eye lens which converts information about the angle of light rays incident thereon into positional information, wherein two end faces, respectively comprising incidence and emergence surfaces, differ from each other in the degree of surface finish determined from the optical point of view.

* * * * *

UNITED STATES PATENT AND TRADEMARK OFFICE
CERTIFICATE OF CORRECTION

PATENT NO. : 4,998,191
DATED : March 5, 1991
INVENTOR(S) : Yasuyuki TEJIMA et al.

It is certified that error appears in the above-indentified patent and that said Letters Patent is hereby corrected as shown below:

On the cover page, at item [57], line 3 under ABSTRACT, change "a" (second occurrence) to ---. A---.

Signed and Sealed this

Twenty-first Day of February, 1995

Attest:

BRUCE LEHMAN

Attesting Officer

Commissioner of Patents and Trademarks